US010839879B2

(12) United States Patent
Gupta et al.

(10) Patent No.: US 10,839,879 B2
(45) Date of Patent: Nov. 17, 2020

(54) READ TECHNIQUES FOR A MAGNETIC TUNNEL JUNCTION (MTJ) MEMORY DEVICE WITH A CURRENT MIRROR

(71) Applicant: Taiwan Semiconductor Manufacturing Co., Ltd., Hsin-Chu (TW)

(72) Inventors: Gaurav Gupta, Hsinchu (TW); Chung-Te Lin, Tainan (TW); Katherine Chiang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/169,195

(22) Filed: Oct. 24, 2018

(65) Prior Publication Data

US 2020/0105327 A1 Apr. 2, 2020

Related U.S. Application Data

(60) Provisional application No. 62/737,229, filed on Sep. 27, 2018.

(51) Int. Cl.
*G11C 11/16* (2006.01)
*H01L 43/02* (2006.01)
(Continued)

(52) U.S. Cl.
CPC ........ *G11C 11/1673* (2013.01); *G11C 11/161* (2013.01); *G11C 11/1657* (2013.01);
(Continued)

(58) Field of Classification Search
CPC ................ G11C 11/1673; H01L 27/228
See application file for complete search history.

(56) References Cited

U.S. PATENT DOCUMENTS 6,538,940 B1 * 3/2003 Nahas .............. G11C 29/12005
365/189.09
7,233,537 B2 * 6/2007 Tanizaki ................ G11C 7/062
365/107

(Continued)

OTHER PUBLICATIONS

Khvalkovskiy et al. "Basic Principles of STT-MRAM Cell Operation in Memory Arrays." Journal of Physics D Applied Physics, Jan. 2013.

(Continued)

*Primary Examiner* — Mushfique Siddique
(74) *Attorney, Agent, or Firm* — Eschweiler & Potashnik, LLC

(57) ABSTRACT

The present application relates to a memory device. The memory device includes a magnetic tunnel junction (MTJ) current path, a reference current path in parallel with the MTJ current path, and a bias current path in parallel with the MTJ current path and the reference current path. The MTJ current path includes a MTJ memory cell configured to switch between a first data state and a second data state. The reference current path includes a reference memory cell. The bias current path is configured to bias the MTJ current path and the reference current path during read operations so the MTJ current path and the reference current path each carry a current level when the first state is read from the MTJ memory cell and each carry the current level when the second state is read from the MTJ memory cell.

20 Claims, 7 Drawing Sheets

(51) Int. Cl.
  *H01L 27/22* (2006.01)
  *H01L 43/10* (2006.01)
(52) U.S. Cl.
  CPC ........ *G11C 11/1659* (2013.01); *H01L 27/228* (2013.01); *H01L 43/02* (2013.01); *H01L 43/10* (2013.01)

(56) References Cited

U.S. PATENT DOCUMENTS

| | | | |
|---|---|---|---|
| 8,027,206 B2 | 9/2011 | Yoon et al. | |
| 8,687,412 B2* | 4/2014 | Chih | G11C 11/1673 365/158 |
| 9,384,792 B2 | 7/2016 | Bonaccio et al. | |
| 9,455,011 B2 | 9/2016 | Raychowdhury et al. | |
| 2009/0010045 A1* | 1/2009 | Ueda | G11C 11/1673 365/158 |
| 2010/0290280 A1* | 11/2010 | Seo | G11C 7/062 365/171 |
| 2013/0010527 A1* | 1/2013 | Ma | G11C 11/1693 365/148 |
| 2013/0070519 A1* | 3/2013 | Lin | G11C 13/004 365/158 |
| 2013/0176773 A1* | 7/2013 | Yuh | G11C 11/1673 365/158 |
| 2013/0265820 A1* | 10/2013 | Chih | G11C 11/15 365/158 |
| 2014/0211549 A1* | 7/2014 | Lin | G11C 11/1675 365/158 |
| 2014/0286088 A1* | 9/2014 | Takahashi | G11C 11/1673 365/158 |
| 2016/0093351 A1* | 3/2016 | Jung | G11C 11/1673 365/158 |
| 2019/0066748 A1* | 2/2019 | Lee | G11C 11/1675 |
| 2019/0295621 A1* | 9/2019 | Ikegami | G11C 11/1673 |
| 2019/0385656 A1* | 12/2019 | Lee | G11C 11/1657 |
| 2020/0005846 A1* | 1/2020 | Liu | G11C 11/1659 |
| 2020/0135252 A1* | 4/2020 | Gupta | G11C 11/1673 |

OTHER PUBLICATIONS

Lee et al. "STT-MRAM Read-Circuit With Improved Offset Cancellation." Journal of Semiconductor Technology and Science, vol. 17, No. 3, Jun. 2017.
Umeki, et al. "A Counter-Based Read Circuit Tolerant to Process Variation for 0.4v Operating STT-MRAM." IPSJ Transactions on System LSI Design Methodology, vol. 9, 79-83, Aug. 2016.
Fong, et al. Spin-Transfer Torque Memories: Devices, Circuits, and Systems.: Proceedings of the IEEE, vol. 104, No. 7, Jul. 2016.
Ren, et al. "A Body-Voltage-Sensing-Based Short Pulse Reading Circuit for Spin-Torque Transfer RAMs (STT-RAMs)." 13th Int'l Symposium on Quality Electronic Design, published in 2012.
DeBrosse, et al. "A 16Mb MRAM Featuring Bootstrapped Write Drivers." 2004 Symposium on VLSI Circuits Digest of Technical Papers, published in 2004.
Jeong, et al. "A 0.24-um 2.0-v 1T1MTJ 16-kb Nonvolatile Magnetoresistance RAM With Self-Reference Sensing Scheme." IEEE Journal of Solid-State Circuits, vol. 38, No. 11, Nov. 2003.
Sun, et al. "Voltage Driven Nondestructive Self-Reference Sensing Scheme of Spin-Transfer Torque Memory." IEEE Transactions on Very Large Scale Integration (VLSI) Systems, vol. 20, No. 11, Nov. 2012.
Lee, Kangho. "Nano-Semiconductors: Devices and Technology." Chapter 8: Embedded Spin-Transfer-Torque MRAM. Published Oct. 24, 2011.

* cited by examiner

READ TECHNIQUES FOR A MAGNETIC TUNNEL JUNCTION (MTJ) MEMORY DEVICE WITH A CURRENT MIRROR

REFERENCE TO RELATED APPLICATION

This Application claims priority to U.S. Provisional Application No. 62/737,229 filed on Sep. 27, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
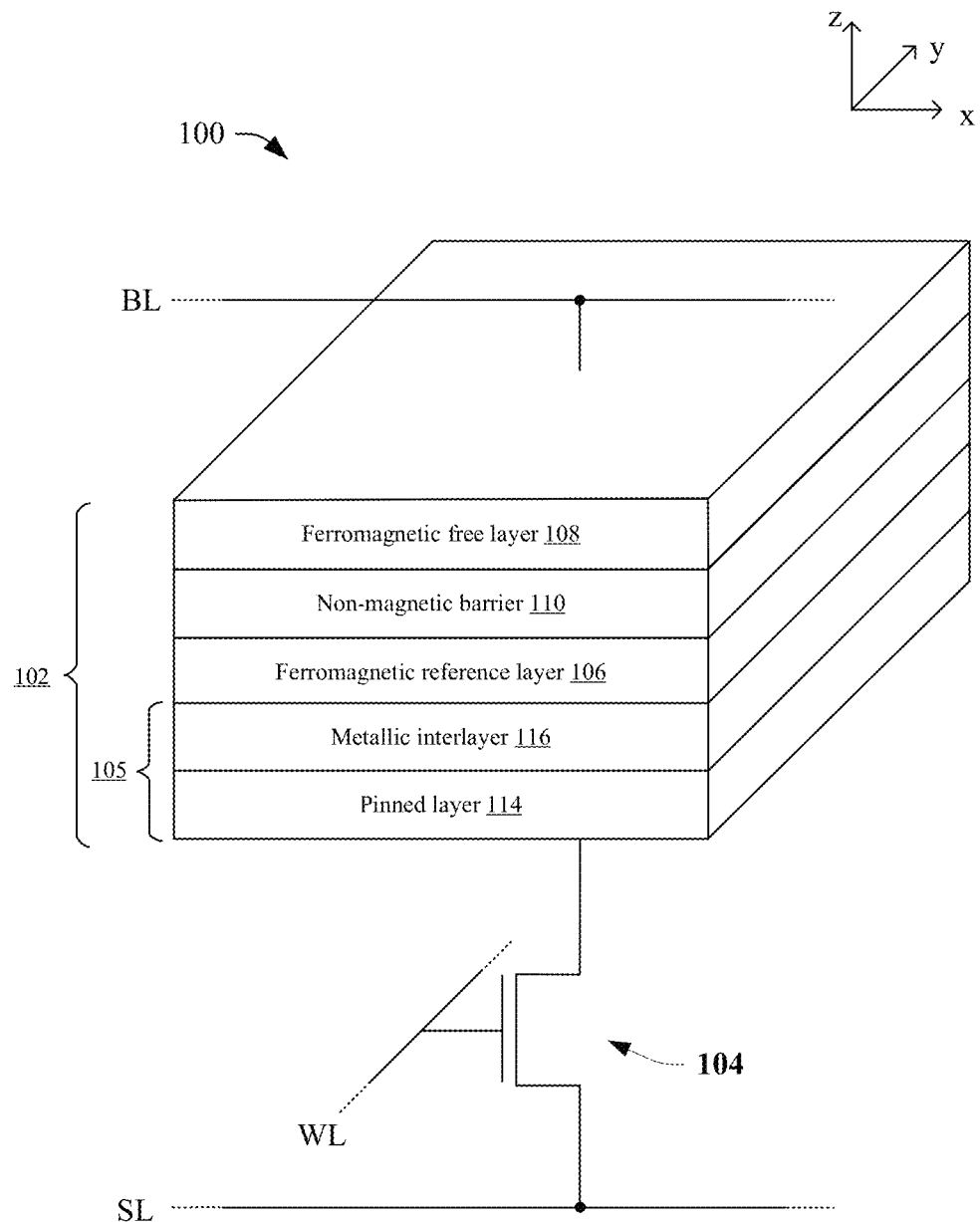
FIG. 1A illustrates a three dimensional view of some embodiments of MTJ memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. For MTJs with positive tunneling magnetoresistance (TMR), if the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). It is noted that MTJs can also have a negative TMR, e.g., lower resistance for anti-parallel orientation and higher resistance for parallel orientation, and though the following description is written in the context of positive TMR based MTJs, it will be appreciated the present disclosure is also applicable to MTJs with a negative TMR.

Because of their binary nature, MTJs are used in memory cells to store digital data, with the low resistance state $R_P$ corresponding to a first data state (e.g., logical "0"), and the high-resistance state $R_{AP}$ corresponding to a second data state (e.g., logical "1"). To read data from such an MTJ memory cell, the MTJ's resistance $R_{MTJ}$ (which can vary between $R_P$ and $R_{AP}$, depending on the data state that is stored) can be compared to a reference cell's resistance, $R_{Ref}$ (where $R_{Ref}$, for example, is designed to be in between $R_P$ and $R_{AP}$, for instance an average). In some techniques, a given read voltage $V_{Read}$ is applied to the MTJ memory cell and to the reference cell. This read voltage results in a read current flowing through the MTJ ($I_{MTJ}$) and a reference current flowing through the reference cell ($I_{Ref}$). If the MTJ is in a parallel state, the read current $I_{MTJ}$ has a first value ($I_{MTJ-P}$) greater than $I_{Ref}$; while if the MTJ is in an anti-parallel state, the read current $I_{MTJ}$ has a second value ($I_{MTJ-AP}$) that is less than $I_{Ref}$. Thus, during a read operation, if $I_{MTJ}$ is greater than $I_{Ref}$, then a first digital value (e.g., "0") is read from the MTJ cell. On the other hand, if $I_{MTJ}$ is less than $I_{Ref}$ for the read operation, then a second digital value (e.g., "1") is read from the MTJ cell.

Under this scheme, however, there is nearly no current difference between $I_{Ref}$ and $I_{MTJ}$ for the read operations of the parallel state and anti-parallel state, i.e. $I_{Ref}$, $I_{MTJ-P}$ and $I_{MTJ-AP}$ are nearly same. In fact the designer should intend them to be exactly same, with minor differences resulting due to loading effect of the resistances or non-idealities like short-channel effects or $g_m$ variations in the transistors. Although a large read current would provide good signal separation between $R_P$ and $R_{AP}$, a large read current may inadvertently overwrite the free layer in the MTJ. Conversely, though a small read current would be less likely to overwrite the free layer, a small read current may provide poor signal separation between $R_P$ and $R_{AP}$. Further, as the size of the MTJ is scaled down, the resistance of the MTJ increases and exacerbates these read operation issues.

The present disclosure provides techniques for reading MTJ memory cells which scales as the size of the MTJ is reduced for successive technology nodes, thereby maintaining the readability of the detection signal. In contrast, for previous techniques the detected signal degrades with the successive technology nodes. This is so because as the MTJ is scaled down for any given RA-product (Resistance-Area product is the fixed technology parameter and normally remains invariant across them, for change in it designer is advised to change the circuit design accordingly), the area of the MTJ decreases. This results in an increase in the resistance $R_{MTJ}$ of the MTJ. The resistance of the reference resistor $R_{Ref}$ is scaled up accordingly. The difference in the current between the MTJ cell and the reference cell, i.e. ΔI (ΔI$_P$ or ΔI$_{AP}$ respectively for MTJ in P-state and AP-state) scales inversely with the $R_{Ref}$ (ΔI~$V_{Read}$|$R_{MTJ}$–$R_{Ref}$|/($R_{MTJ}$·$R_{Ref}$)). Hence, as technology nodes advance, the detected signal degrades phenomenally. Furthermore, at advanced node the node voltage i.e., the supply voltage at which the circuits operate, also scales down. This results in even further reduced read voltage $V_{Read}$, which results in even further degradation of the detected signal ΔI. In contrast, the present disclosure detects the voltage difference ΔV (ΔV$_P$ or ΔV$_{AP}$ respectively for MTJ in P-state and AP-state) between MTJ cell and reference cell for a current bias $I_{Bias}$. As the technology node advances, the $I_{Bias}$ is scaled down for instance in proportion to area. However since resistance has scaled-up with scaling down of the area, the detected signal (ΔV~$I_{Bias}$*|$R_{MTJ}$–$R_{Ref}$|) automatically adjusts to maintain the readout signal. Hence, the technique presented in the disclosure automatically scales with the technology nodes.

In some embodiments, the access transistors of the memory cell operate in a sub-threshold saturation mode of operation, which helps to reduce current while enabling a constant current-bias to the read circuit. In some embodiments, these techniques reduce power consumption by using lower current and voltage levels than previous approaches, and can also reduce read-disturb rates for the memory cells.

FIG. 1A illustrates some embodiments of a magnetic tunnel junction (MTJ) memory cell 100 that can be used with various read techniques as provided herein. The MTJ memory cell 100 includes a magnetic tunnel junction (MTJ) memory element 102 and an access transistor 104. A bit-line (BL) is coupled to one end of the MTJ memory element 102, and a source-line (SL) is coupled to an opposite end of the MTJ memory element through the access transistor 104. Thus, application of a suitable word-line (WL) voltage to a gate electrode of the access transistor 104 couples the MTJ memory element 102 between the BL and the SL, and allows a bias to be applied over the MTJ memory element 102 through the BL and the SL. Consequently, by providing suitable bias conditions, the MTJ memory element 102 can be switched between two states of electrical resistance, a first state with a low resistance (magnetization directions of reference layer and free layer are parallel) and a second state with a high resistance (magnetization directions of reference layer and free layer are antiparallel), to store data.

The MTJ memory element 102 includes a pinned structure 105, a ferromagnetic reference layer 106 over the pinned structure 105, and a ferromagnetic free layer 108 over the ferromagnetic reference layer 106. A non-magnetic barrier layer 110 separates the ferromagnetic reference layer 106 from the ferromagnetic free layer 108. Although this disclosure is described largely in terms of MTJs, it is also to be appreciated that it is applicable to spin valve memory elements, which may use a magnetically soft layer as the ferromagnetic free layer 108, and a magnetically hard layer as the reference layer 106, and a non-magnetic barrier separating the magnetically hard layer and magnetically soft layer.

In some embodiments, the pinned structure 105 is a multi-layer structure that includes a pinned layer 114 and a thin metallic interlayer 116 over the pinned layer 114. The magnetization direction of the pinned layer 114 is constrained or "fixed". In some embodiments, the pinned layer 114 comprises CoFeB, and the metallic interlayer 116 comprises ruthenium (Ru). The metallic interlayer 116 has a predetermined thickness, which introduces a strong anti-parallel coupling between the pinned layer 114 and the ferromagnetic reference layer 106. For example, in some embodiments where the metallic interlayer 116 is a transition metal, a transition metal alloy, or even an oxide to provide strong anti-ferromagnetic interlayer-exchange coupling (IEC), the metallic interlayer 116 has a thickness ranging from 1.2 angstroms to approximately 30 angstroms. In some embodiments, the metallic interlayer 116 is a ruthenium (Ru) layer or iridium (Ir) layer.

The ferromagnetic reference layer 106 has a magnetization direction that is "fixed". In some embodiments, the ferromagnetic reference layer 106 is a CoFeB layer. The magnetic moment of the ferromagnetic reference layer 106 is opposite to that of the pinned layer 114. For example, in the example of FIG. 1A, the magnetization direction of the pinned layer 114 can point upwards along the z axis, and the magnetization direction of the ferromagnetic reference layer 106 can point downwards along the z axis, although in other embodiments these magnetic directions could be "flipped" so the pinned layer 114 points downward and the reference layer 106 points upwards. The magnetization directions can also be in-plane (e.g., pointing in the x and/or y directions), rather than up-down depending on the implementation.

In some embodiments, the non-magnetic barrier layer 110 can comprise an amorphous barrier, such as aluminum oxide (AlO$_x$) or titanium oxide (TiO$_x$); or a crystalline barrier, such as manganese oxide (MgO) or spinel (MgAl$_2$O$_4$ a.k.a. MAO). In embodiments, the non-magnetic barrier 110 is a tunnel barrier which is thin enough to allow quantum mechanical tunneling of current between the ferromagnetic free layer 108 and ferromagnetic reference layer 106. In alternative embodiments where the MTJ is replaced with a spin valve, the non-magnetic barrier layer 110 is typically a non-magnetic metal. Examples of non-magnetic metals include, but are not limited to: copper, gold, silver, aluminum, lead, tin, titanium and zinc; and/or alloys such as brass and bronze.

The ferromagnetic free layer 108 is capable of changing its magnetization direction between one of two magnetization states, which have different resistances and which correspond to binary data states stored in the memory cell. In some embodiments, the ferromagnetic free layer 108 can comprise a magnetic metal, such as iron, nickel, cobalt and alloys thereof, for example. For instance, in some embodiments, the ferromagnetic free layer 108 can comprise cobalt, iron, and boron, such as a CoFeB ferromagnetic free layer; and the non-magnetic barrier 110 can comprise an amorphous barrier, such as aluminum oxide ($AlO_x$) or titanium oxide ($TiO_x$), or a crystalline barrier, such as manganese oxide (MgO) or spinel ($MgAl_2O_4$).

For example, in a first state, the ferromagnetic free layer 108 can have a first magnetization direction in which the magnetization of the ferromagnetic free layer 108 is aligned in parallel with the magnetization direction of the ferromagnetic reference layer 106, thereby providing the MTJ memory element 102 with a relatively low resistance. In a second state, the ferromagnetic free layer 108 can have a first magnetization is aligned anti-parallel with the magnetization direction of the ferromagnetic reference layer 106, thereby providing the MTJ memory element 102 with a relatively high resistance.

Figure 1B:
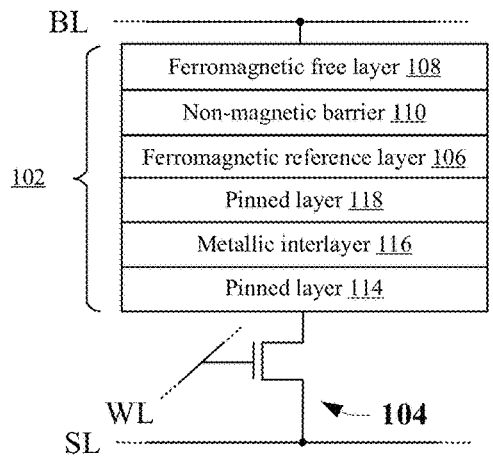
FIGS. 1B-1F illustrate some alternative embodiments for a pinning structure of an MTJ memory cell.

FIG. 1B illustrates a case where 118 and 114 are anti-ferromagnetically coupled, such that 118 and 114 collectively form a synthetic anti-ferromagnet (SAF)". This coupling is due to 116, which can be a transition metal, such as Ruthenium or Iridium.

Figure 1C:
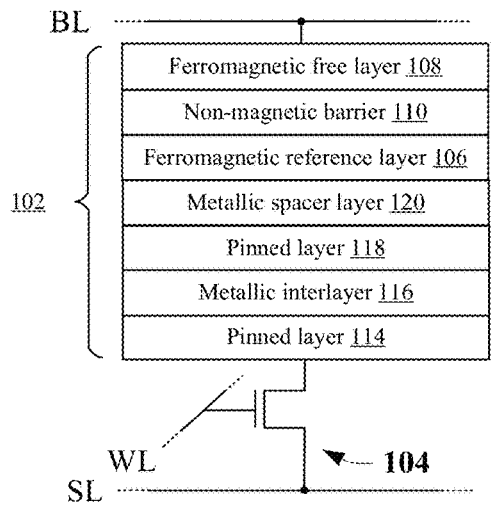

FIG. 1C is an alternate representation of FIG. 1B. It additionally illustrates a metallic spacer between ferromagnetic reference layer 106 and layer 118. The role of this metallic spacer is to draw away boron from ferromagnetic reference layer 106 during annealing. Spacer metallic layer 120 can be a transition metal, such as Ta, Hf, Mo, W or their alloys with CoFeB.

Figure 1D:
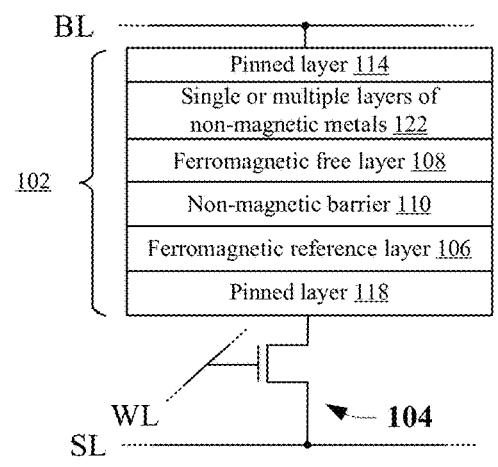

FIG. 1D illustrated an example where layers ferromagnetic reference layer 106 and layer 118 may or may not form a composite layer, yet are illustrated separately. In such cases, the pinned layer 114 is deposited on the top side instead of the bottom side. The magnetization direction of 114 is opposite of that of ferromagnetic reference layer 106 and layer 118, where ferromagnetic reference layer 106 and layer 118 have the same magnetization direction.

Figure 1E:
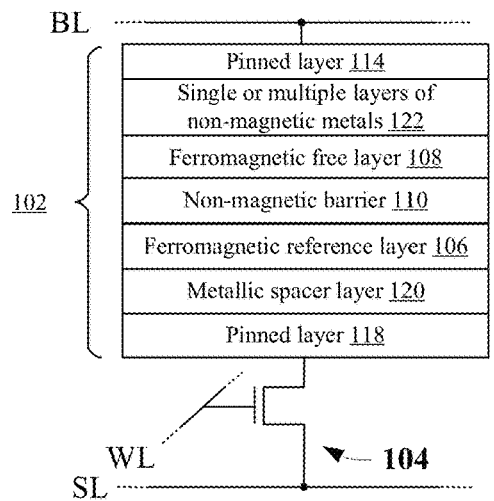

FIG. 1E is an alternate representation of FIG. 1D with explicit illustration of the spacer metallic layer 120.

Figure 1F:
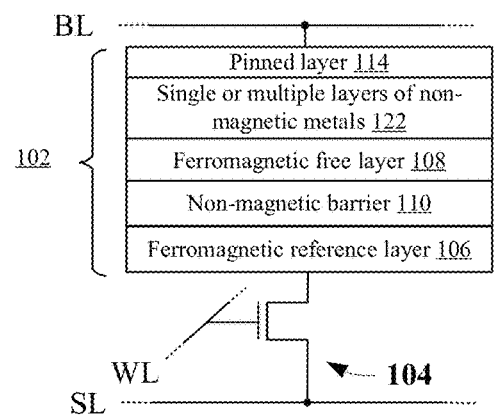

FIG. 1F is an alternate representation of FIG. 1E where element 106 subsumes the elements 106, 120, and 118, as it did in FIG. 1A.

Figure 2:
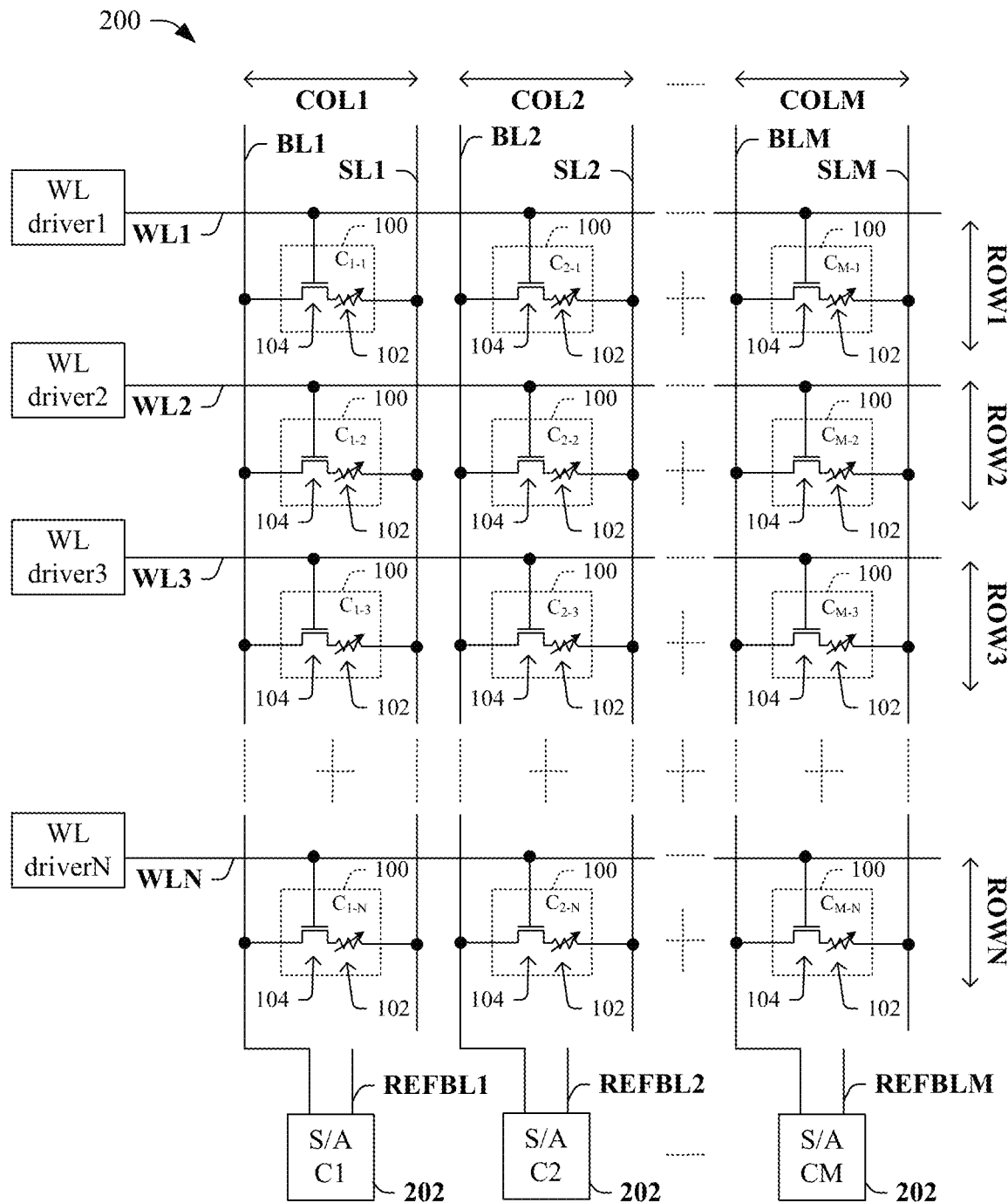
FIG. 2 illustrates a diagram depicting some embodiments of a memory device including an array of MTJ memory cells and associated read circuitry.

FIG. 2 illustrates a memory device 200 that includes a number of MTJ memory cells 100 according to some embodiments of the present disclosure. Each MTJ memory cell 100 includes an MTJ memory element 102 and an access transistor 104. The MTJ memory cells 100 are arranged in M columns (bits) and N rows (words), and are labeled $C_{ROW\text{-}COLUMN}$ in FIG. 2. Word-lines (WL) extend along respective rows, and are coupled to gate electrodes of the access transistors 104 along the respective rows. Bit-lines (BL) and source-lines (SL) extend along respective columns, with the BLs being coupled to the ferromagnetic floating layers of the MTJ memory elements 102, and the SLs being coupled to the reference layers of the MTJ memory elements 102 through the access transistors 104. For example, in Row 1 of the memory device 200, the cells $C_{1\text{-}1}$ through $C_{M\text{-}1}$ form an M-bit data word accessible by activation of word-line WL1. Thus, when WL1 is activated, data states can be written to or read from the respective cells $C_{1\text{-}1}$ through $C_{M\text{-}1}$ through bit-lines $BL_1$ through $BL_M$ and/or by source-lines $SL_1$ through $SL_M$. Each column also has a sense amplifier (S/A) that is used to detect a stored data state from an accessed cell of the column during a read operation. Thus, the data in the accessed cells is sensed using sense amp circuits 202 (S/A $C_1$ through S/A $C_M$) associated with columns 1 through M, respectively. For example, when $WL_1$ is activated (other WLs are deactivated), the bit-lines ($BL_1$ through $BL_M$, respectively) develop respective biases corresponding to the respective data states stored in the accessed memory cells ($C_{1\text{-}1}$ through $C_{M\text{-}1}$, respectively); and the sense amps (S/A $C_1$ through S/A $C_M$, respectively) detect the data states from the bit-lines ($BL_1$ through $BL_M$, respectively).

During a typical write operation to Row 1, a voltage $V_{WL}$ is applied to a word-line $WL_1$, wherein the $V_{WL}$ is typically greater than or equal to a threshold voltage of the access transistors 104, thereby turning on the access transistors within Row 1 and coupling the bit-lines $BL_1$-$BL_M$ to the MTJ memory elements 102 in the accessed cells (e.g., memory cells $C_{1\text{-}1}$ through $C_{1\text{-}M}$). Suitable voltages are applied to the bit-lines $BL_1$-$BL_M$ and source-lines $SL_1$-$SL_M$, where the voltage on each bit-line is representative of a data value to be written to the memory cell attached to that bit-line. While Row1 is accessed, the word-lines of the other rows ($WL_2$-$WL_N$) remain off, such that the MTJ memory elements of the other cells remain isolated and are not written to or read from.

During a typical read operation of Row 1, voltage $V_{WL}$ is again applied to word-line $WL_1$ to turn on the access transistors 104 and couple the bit-lines $BL_1$ through $BL_M$ to the MTJ memory elements of the accessed cells ($C_{1\text{-}1}$ through $C_{1\text{-}M}$). The MTJ memory elements then discharge charge through the access transistors 104 to the bit-lines $BL_1$ through $BL_M$, based on their stored states, thereby causing the bit-line voltages $BL_1$-$BL_M$ to change. The amount by which the bit-line voltages change depends upon the state of the MTJ memory elements 102 being accessed. To determine whether the state of the MTJ memory elements being accessed is a "1" or a "0", one differential input terminal of each sense amp 202 is coupled to the bit-line of the column (e.g., S/A C1 is coupled to bit-line $BL_1$) and the other differential sense amp input is coupled to a reference voltage (e.g., reference bit-line $REFBL_1$ in this example). Depending upon whether the cell bit-line $BL_1$ is high or low relative to the reference voltage on $REFBL_1$, the sense amp returns a "1" or a "0".

Figure 3:
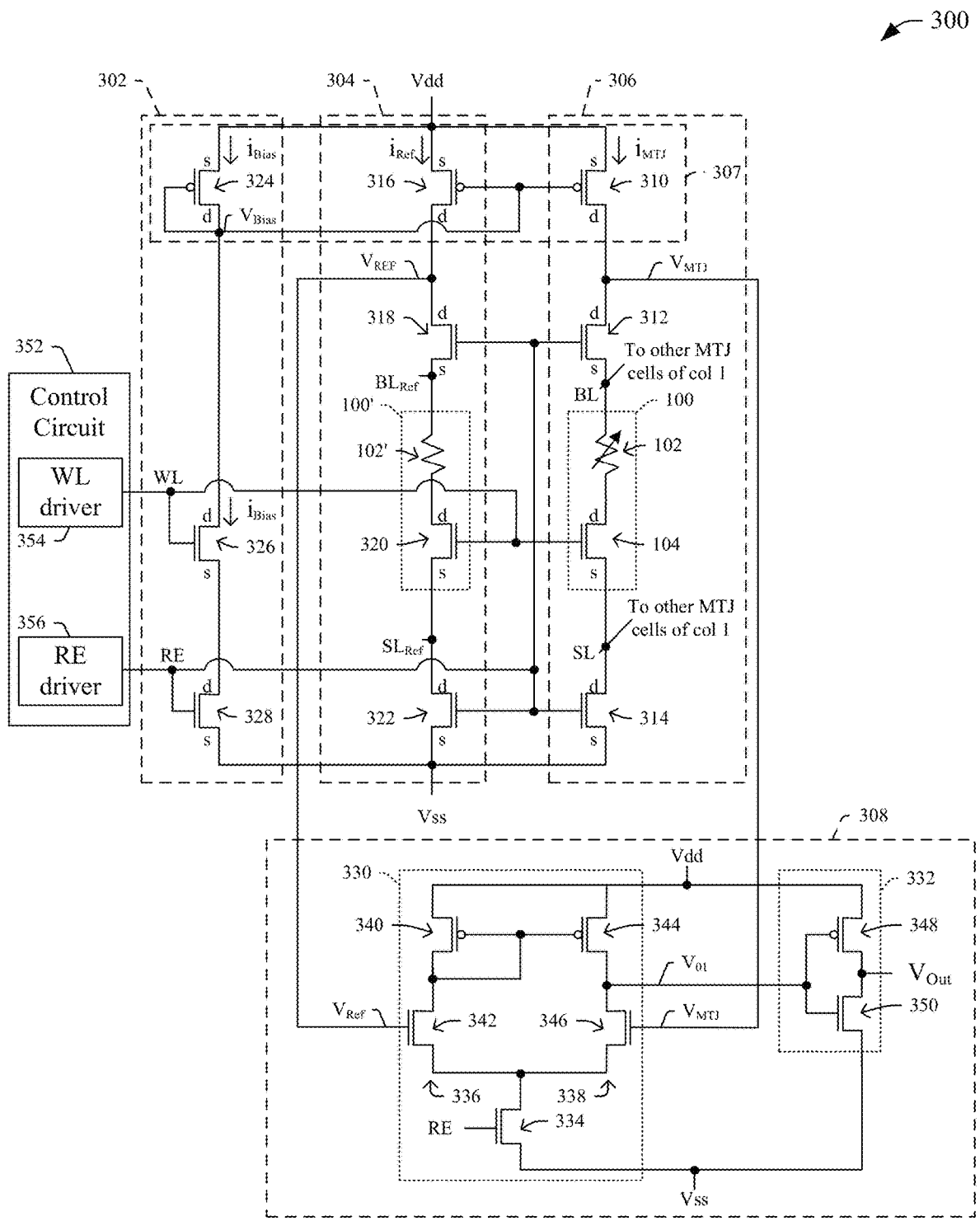
FIG. 3 illustrates a circuit schematic for some embodiments of a data path that can be used in the memory device of FIG. 2.

It will be appreciated that current can flow in various directions depending on the implementation. In some embodiments, read current flows from the BL to the SL. However, a backward read can also occur in other embodiments, in which read current flows from the SL to the BL. Also, the entire MTJ structure can be fabricated upside down, and is called top-pinned MTJ. Hence, in the case of a top-pinned MTJ, the BL is nearer the reference layer 106 and the SL is nearer the ferromagnetic free layer 108. FIG. 3 illustrates a schematic view of a data path 300 of the memory array in more detail. The data path 300 corresponds to a single column of the memory array of FIG. 2, albeit along with some standard additional circuitry which was omitted from FIG. 2 for simplicity. For clarity, the data path 300 is illustrated with only a single MTJ memory cell 100, though it will be appreciated that additional memory cells can be arranged in parallel with the illustrated MTJ memory cell 100 via BL and SL consistent with FIG. 2. A structural description of this data path is now provided, and then a more detailed description of the functionality of the data path is provided with regards to FIGS. 4-5 further below.

The data path 300 includes a bias current path 302, a reference current path 304, and an MTJ current path 306, which are arranged in parallel with one another between $V_{DD}$ and $V_{SS}$. A sense amp 308 is configured to detect a data state from the MTJ memory cell 100 by comparing a voltage provided by the accessed memory cell ($V_{MTJ}$) with a reference voltage ($V_{Ref}$) provided by a reference memory cell 100'. Based on these voltages ($V_{MTJ}$, $V_{Ref}$), the sense amp 308 provides an output voltage ($V_{Out}$) that is in one of two states, representing a logical "1" or a logical "0", which was stored in the accessed memory cell 100.

More particularly, the MTJ current path 306 includes a first current mirror transistor 310, a first pull-up read-enable transistor 312, the MTJ memory cell 100 (including an MTJ memory element 102 and a first access transistor 104), and a first pull-down read-enable transistor 314. Bit-line (BL) and source-line (SL) are coupled to opposite ends of the MTJ memory element 102. The BL is coupled to the MTJ memory element 102; and the SL is coupled to the first access transistor 104 and is separated from the MTJ memory element 102 by the first access transistor 104. In some embodiments, the first current mirror transistor 310 is a PMOS transistor having a width of 0.9 scalable units (u) and a length of 0.18 u; and $V_{DD}$ is 1.8 volts. In some embodiments, the first pull-up read-enable transistor 312 is an NMOS transistor having a width of 0.9 u and a length of 0.18 u. In some embodiments, the first access transistor 104 is an NMOS transistor having a width of 1.08 u and a length of 0.18 u. In some embodiments, the first pull-down read-enable transistor 314 is an NMOS transistor having a width of 0.9 u and a length of 0.18 u.

The reference current path 304 includes a second current mirror transistor 316; a second pull-up read-enable transistor 318; the reference MTJ memory cell 100' (including a reference MTJ memory element 102', which can be implemented as a resistor with a fixed resistance in some embodiments, and a second access transistor 320); and a second pull-down read-enable transistor 322. A reference bit-line ($BL_{Ref}$) and reference source-line ($SL_{Ref}$), which have lengths and resistances that are substantially equal to those of the BL and SL, are coupled to opposite ends of the reference MTJ memory cell 100'. The $BL_{Ref}$ is coupled to the reference MTJ memory element 102'; and the $SL_{Ref}$ is coupled to the second access transistor 320 and is separated from the reference MTJ memory element 102' by the second access transistor 320. In some embodiments, the second current mirror transistor 316 is a PMOS transistor having a width of 0.9 u and a length of 0.18 u. In some embodiments, the second pull-up read-enable transistor 318 is an NMOS transistor having a width of 0.9 u and a length of 0.18 u. In some embodiments, the second access transistor 320 is an NMOS transistor having a width of 1.08 u and a length of 0.18 u. In some embodiments, the second pull-down read-enable transistor 322 is an NMOS transistor having a width of 0.9 u and a length of 0.18 u.

The bias current path 302 includes a third current mirror transistor 324, source transistor 326, and a second pull-down read-enable transistor 328. In some embodiments, the third current mirror transistor 324 is a PMOS transistor having a width of 0.9 u and a length of 0.18 u. In some embodiments, the transistor 326 is an NMOS transistor having a width of 1.08 u and a length of 0.18 u. In some embodiments, the third pull-down read-enable transistor 328 is an NMOS transistor having a width of 0.9 u and a length of 0.18 u.

The third current mirror transistor 324 is diode tied such that its gate and drain are tied together. The gates of the first current mirror transistor 310, second current mirror transistor 316, and third current mirror transistor 324 are tied together to establish a current mirror 307. Thus, during operation, a bias voltage ($V_{Bias}$) is developed on the drain of the third current mirror transistor 324, and this bias voltage is provided to the gates of the first, second, and third current mirror transistors 310, 316, 324. This bias voltage induces an MTJ current $I_{MTJ}$ on the MTJ current path 306, a reference current $I_{Ref}$ on the reference current path 304.

A control circuit 352, which includes a word-line driver circuit 354 and a read-enable (RE) driver circuit 356, provides control signals to the data path to facilitate read and write operations. The word-line driver circuit 354 has an output coupled to a word-line WL, and the word-line is coupled to respective gates of the first access transistor 104, the second access transistor 320, and the source transistor 326. The word-line driver circuit 354 is configured to provide a word-line voltage signal WL during read and write operations. During read operations, the word-line driver circuit 354 is configured to apply a word-line read voltage to the word-line that puts each of the first access transistor 104, second access transistor 320, and source transistor 326 in a sub-threshold saturation mode of operation. In contrast, during write operations, the word-line driver circuit 354 is configured to apply a word-line write voltage to the word-line that puts second access transistor 320 in inverted triode or inverted saturation mode of operation. The RE driver circuit 356 has an output coupled to the gates of transistors 312, 314, 318, 322, and 328, and is configured to provide a read-enable voltage signal RE during read and write operations. RE is typically low (e.g., 0 volts) during write operations, and is typically high ($V_{DD}$) during read operations.

The sense amp 308 includes a differential bias detection circuit 330, and an output buffer 332. The differential voltage detection circuit 330 has a first input terminal coupled to the MTJ current path 306 on which $V_{MTJ}$ is provided, and has a second input terminal coupled to the reference current path 304 on which $V_{Ref}$ is provided. The differential voltage detection circuit 330 detects a differential bias between $V_{MTJ}$ and $V_{Ref}$, and provides an output voltage on $V_{O1}$ based on the detected differential bias. The output buffer 332 inverts and amplifies the output voltage on $V_{O1}$ to provide a digital output signal ($V_{Out}$) which is in either a "1" state or a "0" state depending on the value read from the MTJ cell 100.

The differential bias detection circuit 330 includes a current control transistor 334, and first and second current paths 336, 338 that branch off the current control transistor 334. The first current path 336 includes a first pull-up voltage element 340 and a first pull-down voltage element 342, and the second current path 338 includes a second pull-up voltage element 344 and a second pull-down voltage element 346. Transistors 340 and 344 form the current-mirror and serve as an active load to the transistors 342 and 346, thereby forming the differential amplifier. In some embodiments, the current control transistor 334 is an NMOS transistor having a width of 0.18 u and a length of 0.18 u. In some embodiments, the first and second pull-up voltage elements 340, 344 are each a PMOS transistor having a width of 0.9 u and a length of 0.18 u; and the first and second pull-down voltage elements 342, 346 are each an NMOS transistor having a width of 0.18 u and a length of 0.18 u.

The output buffer 332 includes an output pull-up transistor 348 and an output pull-down transistor 350 that act as an inverter and buffer the output voltage on $V_{O1}$ to deliver $V_{Out}$. In some embodiments, the output pull-up voltage transistor 348 is a PMOS transistor having a width of 0.742354 u and a length of 0.18 u; and the output pull-down voltage transistor 350 is an NMOS transistor having a width of 0.18 u and a length of 0.18 u. The core objective is to design the output buffer 332 as a balanced inverter, i.e. the pull-up strength of transistor 348 has been matched to the pull-down transistor 350. The gate widths or number of fins or frontend process can be tuned to achieve this objective. This sets the bias of the gate and drain terminals of transistors 348 and 350 at the mean of $V_{DD}$ and $V_{SS}$. The exact match of strengths is not mandatory, and tolerable mismatch depends on the specific design margins. In other embodiments, additional inverters may be present so the output signal $V_{Out}$ provided by the output buffer 332 can be inverted or non-inverted relative to $V_{O1}$.

Figure 4:
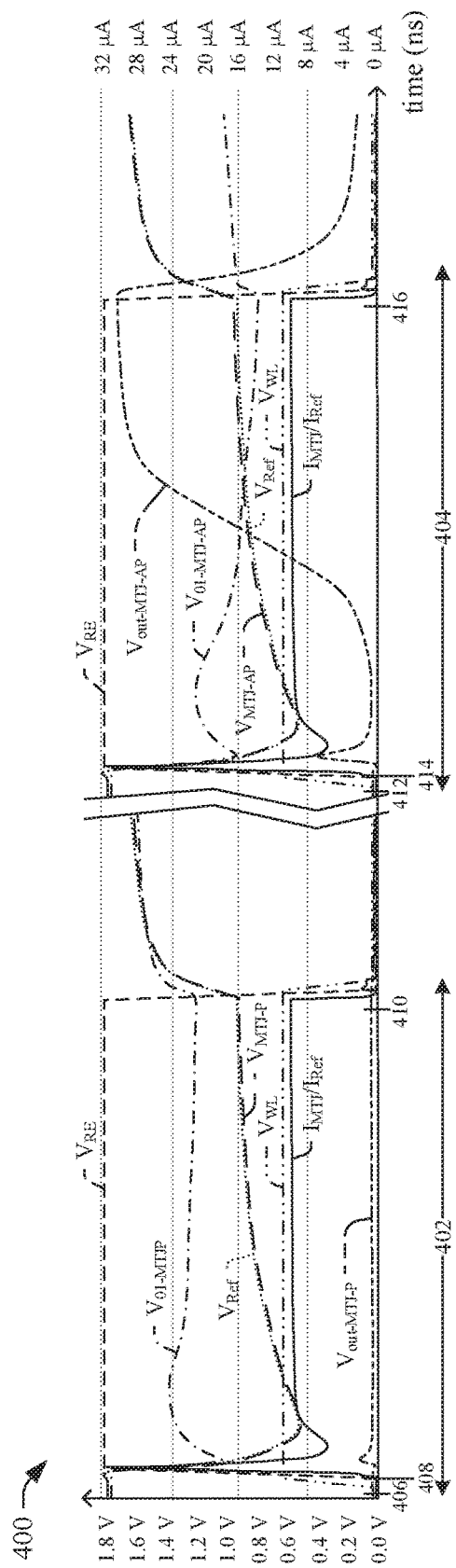
FIGS. 4-5 illustrate timing diagrams depicting some embodiments of read operations for a memory device, such as the memory device shown in FIGS. 2-3.
Figure 5:
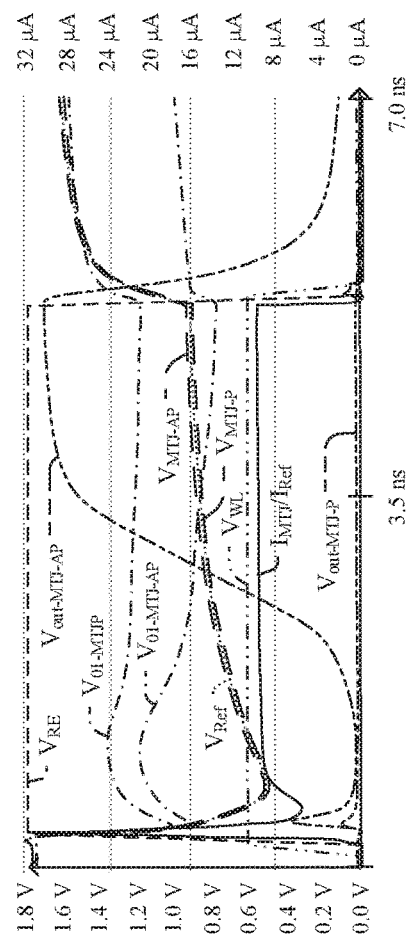

Referring now to FIG. 4, a description of some embodiments of how the data path 300 can operate during read operations is provided with regards to a timing/waveform diagram. FIG. 4 shows waveforms for two read operations on a single MTJ memory cell, and FIG. 5 depicts these waveforms superimposed over one another to show how the current and voltage levels relate to one another. For a first read operation during time 402, the MTJ is in a parallel state, such that the first read operation returns a low voltage (e.g., logical "0"). For the second read operation during time 404, the MTJ is in an anti-parallel state, such that the second read operation returns a high voltage (e.g., logical "1"). These read operations are described in more detail below.

Prior to the first read operation 402, the $V_{WL}$ and $V_{RE}$ signals are each initially low, such that the current paths 302, 304, and 306 are each "open" so no current flows at this during time 406. Since, the current-path 302 is inactive the voltage at the node of the third current mirror transistor 324, which is connected in diode mode as noted earlier, is $V_{DD}$.

At time 408, $V_{WL}$ and $V_{RE}$ are driven high (either together or slightly one after another as deemed suitable by the designers for their specific designs; the choice does not affect the description of the operation herein). This sets the current paths 302, 304, and 306 each into the conductive mode. The source transistor 326 is designed to be in sub-threshold saturation mode for the chosen set of voltage $V_{DD}$ and word-line voltage $V_{WL}$, for instance by suitably designing its channel width (for instance it is 1.08 u in this exemplar representation). Since, a voltage $V_{DD}$ at the drain node of third current mirror transistor 324 is already present; the source transistor 326 immediately gets immediately biased into this desired sub-threshold saturation region and generates current $I_{Bias}$. Next, since source transistor 326 and pull-down transistor 328 have a finite resistance, they together pull-down the voltage at the node of the drain node of third current mirror transistor 324 to a quiescent value which we subsequently refer as $V_{Bias}$. Since, the source transistor 326 is in saturation region the current $I_{Bias}$ remains unaffected. Hence, the resulting voltage $V_{Bias}$ depends on the precursor current $I_{Bias}$.

This voltage bias $V_{Bias}$ puts the first and second current mirror transistors 310, 316 into conductive states.

This induces currents $I_{MTJ}$ and $I_{Ref}$ to flow through the MTJ current path 306 and reference current path 304, respectively. Notably, $I_{MTJ}$ and $I_{Ref}$ are substantially equal and continuously track one another through first read operation 402. Furthermore, the currents $I_{MTJ}$ and $I_{Ref}$ are proportional to $I_{Bias}$ with exact ratios depending on the ratio of the drive strength of current mirror transistors 310 and 316 respectively with respect to the drive strength of the third current mirror transistor 324. It should further be appreciated that these ratios of the driving strengths provide additional handle for the design of the reference cell. For instance if due to some constraints it is impractical to design $R_{Ref}$ suitably, its effect can be compensated by designing the drive strength of current mirror transistor 316 appropriately. In such a case detected signal $\Delta V$ is still nearly: $I_{MTJ}$ $R_{MTJ}-I_{Ref} R_{Ref}$. In the exemplar representation in this disclosure the driving strength has been set to be same and hence all three currents $I_{Bias}$, $I_{MTJ}$ and $I_{Ref}$ are equal, with some unwanted minor difference resulting due to non-ideal transistors. A bias current ($I_{bias}$) which is illustrated in FIG. 3 also flows, although $I_{Bias}$ is not explicitly illustrated in FIG. 4 to maintain visual clarity. As $I_{MTJ}$ and $I_{Ref}$ flow, the difference in resistance between the reference resistance 102' and the MTJ resistance 102 gives rise to a voltage difference between $V_{MTJ-P}$ and $V_{Ref}$. During the first read operation, for example, $V_{MTJ-P}$ is slightly less than $V_{Ref}$ due to the fact that the MTJ memory element 102 in the parallel state has a slightly lower resistance that the reference resistance 102'.

This voltage difference between $V_{MTJ}$ and $V_{Ref}$ is provided to the input terminals of the differential bias detection circuit 330 corresponding to the gates of 342 and 346. As noted earlier, transistors 340 and 344 form the current mirror and act as an active load to the transistors 342 and 346 together forming the differential amplifier. For a balanced case (the DC bias of the differential amplifier say at voltage $V_{Mean}=(V_{Ref}+V_{MTJ})/2$), i.e. if $V_{Ref}$ had been equal to $V_{MTJ}$ then equal current would have flowed through transistors 342 and 346. Furthermore, equal voltage at their respective drain terminals would have been observed. However, for an unbalanced case, because $V_{Ref}$ is slightly more than $V_{Mean}$, transistor 342 tends to conduct slightly more and pulls down the drain of 340 more towards $V_{SS}$. Concurrently, since $V_{MTJ-P}$ is slightly less than $V_{Ref}$, the transistor 346 tends to conduct less and thus the voltage $V_{O1}$ at the drain terminal of 346 gets pulled-up more towards $V_{DD}$. The output buffer 332 then receives higher voltage $V_{O1}$ than the bias of the inverter 332, which tends to enable transistor 350 more and pulls $V_{Out}$ down to a low voltage (e.g., logical "0") state, as shown at time 410.

Prior to the second read operation 404, the $V_{WL}$ and $V_{RE}$ signals are each initially low, such that the current paths 302, 304, and 306 are each "open" so no current flows at this during time 412. Since, the current-path 302 is inactive the voltage at the node of the third current mirror transistor 324, which is connected in diode mode as noted earlier, is $V_{DD}$. At time 414, $V_{WL}$ and $V_{RE}$ are driven high (either together or slightly one after another as deemed suitable by the designers for their specific designs; the choice does not affect the description of the operation herein), inducing currents $I_{MTJ-AP}$ and $I_{Ref}$ to flow through the MTJ current path and reference current path, respectively. Again $I_{MTJ}$ and $I_{Ref}$ are equal and continuously track one another through second read operation 404. As $I_{MTJ-AP}$ and $I_{Ref}$ flow, the difference in resistance between the reference resistance and the MTJ resistance gives rise to a voltage difference between $V_{MTJ-AP}$ and $V_{MTJ-Ref}$. During the second read operation, for example, $V_{MTJ-AP}$ is slightly more than $V_{Ref}$ due to the fact that the MTJ memory element 102 in the anti-parallel state has a slightly larger resistance than that of the reference resistor 102'.

This voltage difference between $V_{MTJ-AP}$ and $V_{Ref}$ is provided to the input terminals of the differential bias detection circuit 330 corresponding to the gates of 342, 346. Because $V_{MTJ-AP}$ is slightly more than $V_{Ref}$, transistor 346 tends to conduct more and pulls the output $V_{O1}$ more down towards $V_{SS}$. The output buffer then receives lower voltage $V_{O1}$ than the bias of the inverter 332, which tends to enable 348 more and pulls $V_{Out}$ up to a high voltage (e.g., logical "1") state, as shown at time 416.

Figure 6:
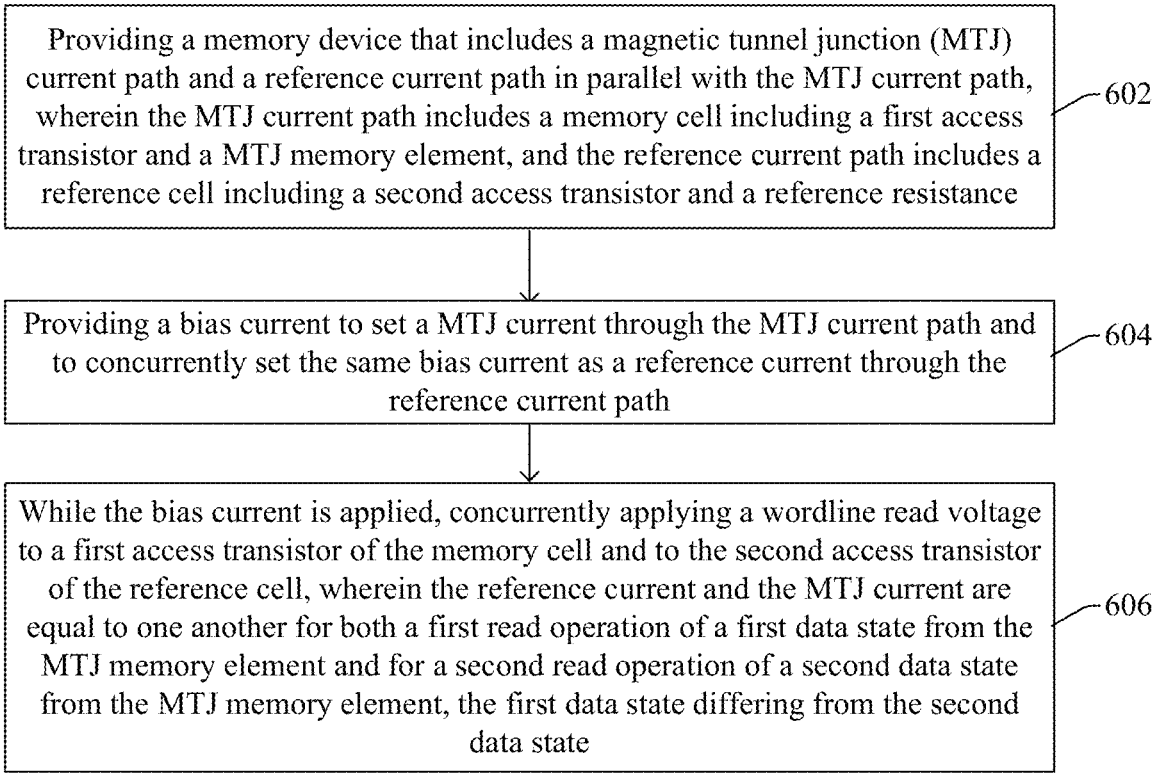
FIG. 6 illustrates a flowchart of some embodiments of a method of reading from magnetic tunnel junction memory device.

FIG. 6 illustrates a flowchart of some embodiments of the method of reading from an MTJ memory cell.

At operation 602 a memory device is provided. The memory device includes a magnetic tunnel junction (MTJ) current path and a reference current path in parallel with the MTJ current path. The MTJ current path includes a memory cell including a first access transistor and a MTJ memory element. The reference current path includes a reference cell including a second access transistor and a reference resistance. In some embodiments, this memory device can, for example, correspond to memory device and data path illustrated in FIGS. 1A-3.

At operation 604, a bias voltage is provided to set a MTJ current through the MTJ current path and to concurrently set a reference current through the reference current path. In some embodiments, the MTJ current can correspond, for example, to signal $I_{MTJ}$ in FIG. 4, and the reference current can correspond, for example, to signal $I_{Ref}$ in FIG. 4.

At operation 606, while the current bias is applied, a word-line read voltage is concurrently applied to a first access transistor of the memory cell and to the second access transistor of the reference cell. The reference current and the MTJ current are equal to one another for both a first read operation of a first data state from the MTJ and for a second read operation of a second data state from the MTJ, the first data state differing from the second data state. In some embodiments, the first read operation can correspond, for example, to time 402 in FIG. 4, and the second read operation can correspond, for example, to time 404 in FIG. 4.

While the flowchart 600 of FIG. 6 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 7:
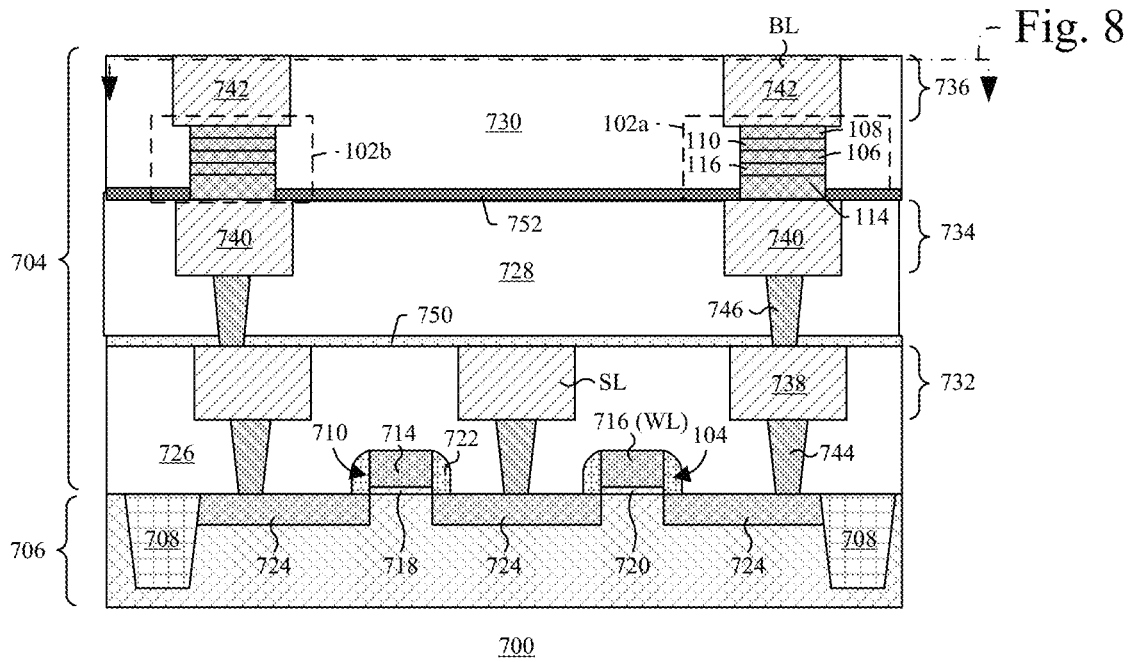
FIG. 7 illustrates a cross-sectional diagram illustrating some embodiments of a memory device that includes an MTJ memory element.

FIG. 7 illustrates a cross sectional view of some embodiments of an integrated circuit 700, which includes MTJ memory elements 102a, 102b disposed in an interconnect structure 704 of the integrated circuit 700. The integrated circuit 700 includes a substrate 706. The substrate 706 may be, for example, a bulk substrate (e.g., a bulk silicon substrate) or a silicon-on-insulator (SOI) substrate. The illustrated embodiment depicts one or more shallow trench isolation (STI) regions 708, which may include a dielectric-filled trench within the substrate 706.

Two access transistors 710, 712 are disposed between the STI regions 708. The access transistors 710, 104 include access gate electrodes 714, 716, respectively; access gate dielectrics 718, 720, respectively; access sidewall spacers 722; and source/drain regions 724. The source/drain regions 724 are disposed within the substrate 706 between the access gate electrodes 714, 716 and the STI regions 708, and are doped to have a first conductivity type which is opposite a second conductivity type of a channel region under the gate dielectrics 718, 720, respectively. The word line gate electrodes 714, 716 may be, for example, doped polysilicon or a metal, such as aluminum, copper, or combinations thereof. The word line gate dielectrics 718, 720 may be, for example, an oxide, such as silicon dioxide, or a high-K dielectric material. The word line sidewall spacers 722 can be made of silicon nitride (e.g., $Si_3N_4$), for example.

The interconnect structure 704 is arranged over the substrate 706 and couples devices (e.g., transistors 710, 104) to one another. The interconnect structure 704 includes a plurality of IMD layers 726, 728, 730, and a plurality of metallization layers 732, 734, 736 which are layered over one another in alternating fashion. The IMD layers 726, 728, 730 may be made, for example, of a low κ dielectric, such as un-doped silicate glass, or an oxide, such as silicon dioxide, or an extreme low K dielectric layer. The metallization layers 732, 734, 736 include metal lines 738, 740, 742, which are formed within trenches, and which may be made of a metal, such as copper or aluminum. Contacts 744 extend from the bottom metallization layer 732 to the source/drain regions 724 and/or gate electrodes 714, 716; and vias 746 extend between the metallization layers 732, 734, 736. The contacts 744 and the vias 746 extend through dielectric-protection layers 750, 752 (which can be made of dielectric material and can act as etch stop layers during manufacturing). The dielectric-protection layers 750, 752 may be made of an extreme low-K dielectric material, such as SiC, for example. The contacts 744 and the vias 746 may be made of a metal, such as copper or tungsten, for example.

MTJ memory elements 102a, 102b, which are configured to store respective data states, are arranged within the interconnect structure 704 between neighboring metal layers. The MTJ memory element 102a includes an MTJ, including a pinned layer 114, a metallic interlayer 116, a ferromagnetic reference layer 106, a non-magnetic barrier layer 110, and a ferromagnetic free layer 108.

Figure 8:
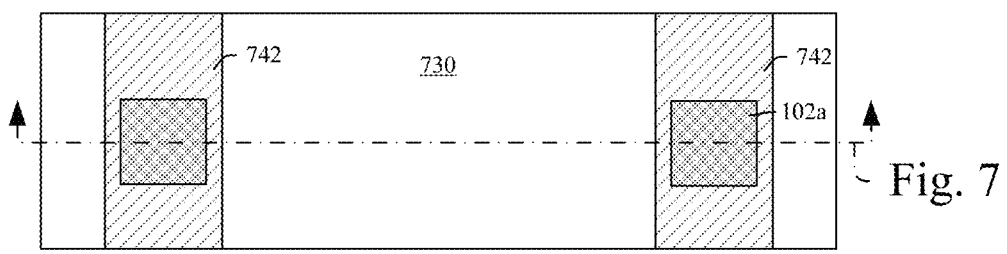
FIG. 8 illustrates a top view of the memory device of FIG. 7, as indicated by the cut-lines in FIG. 7.

FIG. 8 depicts some embodiments of a top view of FIG. 7's integrated circuit 700 as indicated in the cut-away lines shown in FIGS. 7-8. As can be seen, the MTJ memory elements 102a, 102b can have a square/rectangular or circular/elliptical shape when viewed from above in some embodiments. In other embodiments, however, for example due to practicalities of many etch processes, the corners of the illustrated square shape can become rounded, resulting in MTJ memory elements 102a, 102b having a square shape with rounded corners, or having a circular shape. The MTJ memory elements 102a, 102b are arranged over metal lines 740, respectively, and have upper portions in direct electrical connection with the metal lines 742, respectively, without vias or contacts there between in some embodiments. In other embodiments, vias or contacts couple the upper portion to the metal lines 742.

Thus, in some embodiments, the present application provides a memory device. The memory device includes a magnetic tunnel junction (MTJ) current path including a MTJ memory cell configured to switch between a first data state and a second data state. The first data state has a first resistance and the second data state has a second resistance differing from the first resistance. A reference current path is in parallel with the MTJ current path. The reference current path includes a reference memory cell having a reference resistance between the first resistance and the second resistance. A bias current path is in parallel with the MTJ current path and the reference current path. The bias current path is configured to bias the MTJ current path and the reference current path during read operations so the MTJ current path and the reference current path each carry a current level when the first state is read from the MTJ memory cell and each carry the current level when the second state is read from the MTJ memory cell.

In other embodiments, the present application provides a method for reading from a memory device. In this method, a magnetic tunnel junction (MTJ) current path is provided, and a reference current path is provided in parallel with the MTJ current path. The MTJ current path includes a memory cell including a first access transistor and a MTJ, and the reference current path includes a reference cell including a second access transistor and a reference resistance. A bias voltage is provided to set a MTJ current through the MTJ current path and to concurrently set a reference current through the reference current path. While the bias voltage is applied, a word-line read voltage is concurrently applied to the first access transistor of the memory cell and to the second access transistor of the reference cell. The reference current and the MTJ current are equal to one another for both a first read operation of a first data state from the MTJ and a second read operation of a second data state from the MTJ. The first data state differs from the second data state.

In yet other embodiments, the present disclosure provides a memory device, including a magnetic tunnel junction (MTJ) memory cell configured to switch between a first data state and a second data state. The first data state has a first resistance and the second data state has a second resistance differing from the first resistance. A reference memory cell has a reference resistance between the first resistance and the second resistance. A current mirror is configured to provide a first current level to the MTJ memory cell during a first read operation when the first data state is read from the MTJ memory cell and during a second read operation when the second data state is read from the MTJ memory cell. The current mirror is further configured to provide a second current level to the reference memory cell during the first read operation and during the second read operation. The first current level continuously tracks the second current level so the first and second current levels are substantially equal throughout the first read operation and throughout the second read operation. Furthermore, the current levels in the first read operation are substantially equal to respective current levels in the second read operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
  a magnetic tunnel junction (MTJ) current path comprising a first current mirror transistor and a MTJ memory cell configured to switch between a first data state and a second data state, the first data state having a first resistance and the second data state having a second resistance differing from the first resistance, wherein the MTJ memory cell includes a MTJ memory element and a first access transistor;
  a reference current path in parallel with the MTJ current path, the reference current path comprising a second current mirror transistor and a reference memory cell having a reference resistance between the first resistance and the second resistance, wherein the reference memory cell includes a reference MTJ memory element and a second access transistor;
  a bias current path in parallel with the MTJ current path and the reference current path and comprising a third current mirror transistor and a source transistor in series with the third current mirror transistor, wherein a drain of the third current mirror transistor is tied to a gate of the third current mirror transistor as well as to gates of the first and second current mirror transistors such that the bias current path is configured to bias the MTJ current path and the reference current path during read operations so the MTJ current path and the reference current path each carry a current level when the first data state is read from the MTJ memory cell and each carry the current level when the second data state is read from the MTJ memory cell; and
  a word-line driver circuit having an output coupled to a word-line that is coupled to respective gates of the first access transistor, the second access transistor, and the source transistor, wherein during read operations the word-line driver circuit is configured to apply a word-line read voltage that puts each of the first access transistor, the second access transistor, and the source transistor in a sub-threshold saturation mode of operation.

2. The memory device of claim 1, further comprising:
  a sense amplifier having a first input terminal and a second input terminal that are configured to receive a differential input signal, the first input terminal coupled to a first node on the MTJ current path and the second input terminal coupled to a second node on the reference current path.

3. The memory device of claim 2, wherein the MTJ current path comprises:
  a first pull-up read-enable transistor in series with the first current mirror transistor;
  wherein a bit-line is coupled between the first pull-up read-enable transistor and the MTJ memory element; and
  a first pull-down read-enable transistor, wherein a source-line is coupled between the MTJ memory element and the first pull-down read-enable transistor.

4. The memory device of claim 3, wherein the first node of the MTJ current path to which the first input terminal of the sense amplifier is coupled is located between the first current mirror transistor and the first pull-up read-enable transistor.

5. The memory device of claim 3, wherein the reference current path comprises:
  a second pull-up read-enable transistor in series with the second current mirror transistor;
  wherein a reference bit-line is coupled between the second pull-up read-enable transistor and the reference MTJ memory element; and
  a second pull-down read-enable transistor, wherein a reference source-line is coupled between the reference MTJ memory element and the second pull-down read-enable transistor.

6. The memory device of claim 5, wherein the second node of the MTJ current path to which the second input terminal of the sense amplifier is coupled is located between the second current mirror transistor and the second pull-up read-enable transistor.

7. The memory device of claim 6, wherein the MTJ memory element comprises:
  a ferromagnetic free layer having a first free face and a second free face opposite the first free face, the first free face coupled to the bit-line;
  a non-magnetic barrier layer coupled to the second free face; and
  a ferromagnetic reference layer coupled between the non-magnetic barrier layer and the source-line, the ferromagnetic reference layer separated from the ferromagnetic free layer by the non-magnetic barrier layer.

8. The memory device of claim 5, wherein the bias current path comprises:

and a third pull-down read-enable transistor in series with the source transistor, wherein the source transistor is arranged between the third current mirror transistor and the third pull-down read-enable transistor.

9. The memory device of claim 8, further comprising:

a read-enable driver circuit having an output coupled to respective gates of the first pull-up read-enable transistor, the second pull-up read-enable transistor, the first pull-down read-enable transistor, and the second pull-down read-enable transistor.

10. The memory device of claim 9, wherein the output of the read-enable driver circuit is coupled to a gate of the third pull-down read-enable transistor.

11. The memory device of claim 1:

wherein the first current mirror transistor has a first length and a first width or a first set of fins, the second current mirror transistor has a second length equal to the first length and a second width equal to the first width or second set of fins equal to the first set of fins, and the third current mirror transistor has a third length equal to the first length and a third width equal to the first width or a set of third fins equal to first set of fins.

12. The memory device of claim 1, wherein the word-line read voltage is approximately 0.6 V.

13. A method for reading from a memory device, comprising:

providing a magnetic tunnel junction (MTJ) current path and a reference current path in parallel with the MTJ current path, wherein the MTJ current path includes a memory cell including a first access transistor and a MTJ, and the reference current path includes a reference cell including a second access transistor and a reference resistance;

providing a current mirror comprising a plurality of current mirror transistors;

providing a bias voltage to a drain of one of the plurality of current mirror transistors and to each gate of the plurality of current mirror transistors to set a MTJ current through the MTJ current path and to concurrently set a reference current through the reference current path; and while the bias voltage is applied, concurrently applying a word-line read voltage to the first access transistor of the memory cell and to the second access transistor of the reference cell, wherein the reference current and the MTJ current are equal to one another for both a first read operation of a first data state from the MTJ and a second read operation of a second data state from the MTJ, the first data state differing from the second data state;

wherein the word-line read voltage is applied with a voltage level that is less than a threshold voltage of the first access transistor.

14. The method of claim 13, further comprising:

sensing a differential voltage between a first point on the MTJ current path and a second point on the reference current path, and providing a voltage detection signal whose voltage level is based on the sensed differential voltage; and buffering the voltage detection signal to output a digital signal whose voltage level is indicative of whether the MTJ was in the first data state or the second data state.

15. The method of claim 13, providing a bias current path in parallel with the reference current path and the MTJ current path, wherein the bias current path comprises a source transistor that receives the word-line read voltage on its gate.

16. The memory device of claim 13, wherein the voltage level associated with the word-line read voltage is approximately 0.6 V.

17. A memory device, comprising:

a magnetic tunnel junction (MTJ) memory cell configured to switch between a first data state and a second data state, the first data state having a first resistance and the second data state having a second resistance differing from the first resistance;

a reference memory cell having a reference resistance between the first resistance and the second resistance; and a current mirror configured to provide a first current level to the MTJ memory cell during a first read operation when the first data state is read from the MTJ memory cell and during a second read operation when the second data state is read from the MTJ memory cell, the current mirror being further configured to provide a second current level to the reference memory cell during the first read operation and during the second read operation, the first current level continuously tracking the second current level so the first and second current levels are substantially equal throughout the first read operation and throughout the second read operation.

18. The memory device of claim 17, further comprising:

a sense amplifier having a first input terminal and a second input terminal that are configured to receive a differential input signal, the first input terminal coupled to the MTJ memory cell and the second input terminal coupled to the reference memory cell.

19. The memory device of claim 17, wherein the first current level continuously tracks the second current level from a first time in the first read operation when a word-line read voltage changes from a first state to a second state until a second time in the first read operation when the word-line read voltage changes back to the first state from the second state.

20. The memory device of claim 17, further comprising:

a word-line driver circuit having an output coupled to a word-line that is coupled to a first gate of a first access transistor in the MTJ memory cell, and a second gate of a second access transistor in the reference memory cell; wherein during read operations the word-line driver circuit is configured to apply a word-line read voltage that puts each of the first access transistor and the second access transistor in a sub-threshold saturation mode of operation.

* * * * *